（12） United States Patent
Lin

(10) Patent No.: US 7,656,324 B2
(45) Date of Patent: Feb. 2, 2010

(54) INTERFACE CONTROL CIRCUIT FOR A PORTABLE PRODUCT

(75) Inventor: Ching-Hsiung Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 12/155,058

(22) Filed: May 29, 2008

(65) Prior Publication Data
US 2009/0243899 A1    Oct. 1, 2009

(30) Foreign Application Priority Data
Mar. 27, 2008   (TW) ............................ 97111104 A

(51) Int. Cl.
*H03M 9/00* (2006.01)
(52) U.S. Cl. ...................... 341/100; 712/124
(58) Field of Classification Search .................. 341/100
See application file for complete search history.

(56) References Cited
U.S. PATENT DOCUMENTS
6,459,393 B1 * 10/2002 Nordman ................ 341/100
6,690,309 B1 * 2/2004 James et al. ............. 341/102
6,768,431 B2 * 7/2004 Chiang ................... 341/100
7,446,680 B2 * 11/2008 Kobayashi .............. 341/100

\* cited by examiner

*Primary Examiner*—Lam T Mai
(74) *Attorney, Agent, or Firm*—Rabin & Berdo, P.C.

(57) ABSTRACT

An interface control circuit including a physical layer receiver, a lane receiver, a bridge circuit, a transmitter command encoder, a lane transmitter and a physical layer transmitter is provided. The physical layer receiver receives and converts serial data into parallel data, and determines to transmit the parallel data in a high speed transmission mode or a low power transmission mode according to the serial data. The lane receiver receives and decodes the parallel data. The bridge circuit outputs the decoded parallel data. If the serial data includes a read command, the transmitter command encoder encodes the parallel data. The lane transmitter receives target parallel data from the bridge circuit, and transmits the target parallel data in the low power transmission mode according to the encoded parallel data. The physical layer transmitter converts the target parallel data into target serial data and outputs the target serial data.

20 Claims, 4 Drawing Sheets

US 7,656,324 B2

1

INTERFACE CONTROL CIRCUIT FOR A PORTABLE PRODUCT

This application claims the benefit of Taiwan application Serial No. 97111104, filed Mar. 27, 2008, the subject matter of which is incorporated herein by reference.

BACKGROUND OF THE INVENTION

1. Field of the Invention

The invention relates in general to an interface control circuit, and more particularly to an interface control circuit featured by low power consumption and low circuit complexity.

2. Description of the Related Art

Conventional portable products normally adopt parallel transmission interfaces. As parallel transmission easily results in electromagnetic interference or cross talk, the wire used in parallel transmission cannot be too long, and the data transmission speed cannot be too high. In addition, the parallel transmission interface has complicated external circuit elements, hence making overall circuit complexity too high. If a serial transmission interface is used, the system can better prevent noise interference but the power consumption is too high.

SUMMARY OF THE INVENTION

The invention is directed to an interface control circuit which reduces power consumption by way of switching between a high speed transmission mode and a low power transmission mode and effectively reduces circuit complexity by way of combining a synchronous circuit with an asynchronous circuit by a clock control circuit.

According to a first aspect of the present invention, an interface control circuit is provided. The interface control circuit includes a physical layer receiver, a lane receiver, a bridge circuit, a transmitter command encoder, a lane transmitter and a physical layer transmitter. The physical layer receiver receives and converts serial data into parallel data, and determines to transmit the parallel data in a high speed transmission mode or a low power transmission mode according to the serial data. The lane receiver receives and decodes the parallel data. The bridge circuit outputs the decoded parallel data. If the serial data includes a read command, the transmitter command encoder encodes the parallel data. The lane transmitter receives target parallel data from the bridge circuit, and converts the target parallel data in the low power transmission mode according to the encoded parallel data. The physical layer transmitter converts the target parallel data into target serial data and outputs the target serial data.

The invention will become apparent from the following detailed description of the preferred but non-limiting embodiments. The following description is made with reference to the accompanying drawings.

2

DETAILED DESCRIPTION OF THE INVENTION

The invention provides an interface control circuit which replaces conventional parallel transmission with serial transmission. The interface control circuit reduces power consumption by way of switching between a high speed transmission mode and a low power transmission mode and reduces circuit complexity by way of effectively combining a synchronous circuit with an asynchronous circuit by a clock control circuit.

Figure 1:
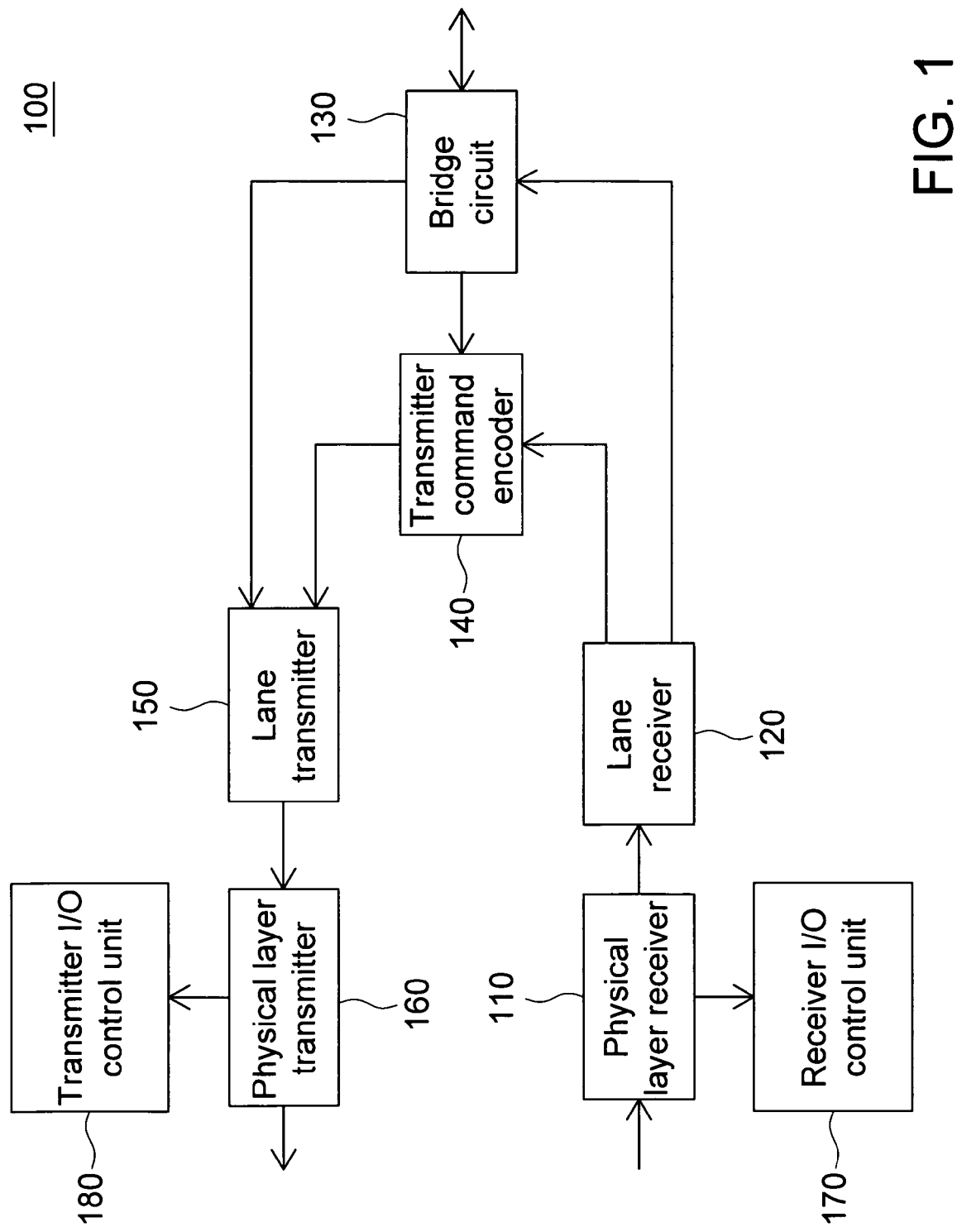
FIG. 1 shows a block diagram of an interface control circuit according to a preferred embodiment of the invention.

Referring to FIG. 1, a block diagram of an interface control circuit according to a preferred embodiment of the invention is shown. The interface control circuit 100 includes a physical layer receiver 110, a lane receiver 120, a bridge circuit 130, a transmitter command encoder 140, a lane transmitter 150, a physical layer transmitter 160, a receiver I/O control unit 170 and a transmitter I/O control unit 180.

The physical layer receiver 110 receives serial data. The serial data being in the format of transistor transistor logic (TTL) signal is emitted from a host for example. The receiver I/O control unit 170 is coupled to the physical layer receiver 110 for controlling the physical layer receiver 110 to receive the serial data. The physical layer receiver 110 converts the serial data into parallel data, and determines to transmit the parallel data in a high speed transmission mode or a low power transmission mode according to the serial data. If the transmission mode is the high speed transmission mode, the physical layer receiver 110 transmits the parallel data in the format of low voltage differential signal (LVDS). If the transmission mode is the low power transmission mode, the physical layer receiver 110 transmits the parallel data in the format of transistor transistor logic signal. The lane receiver 120 receives the parallel data from the physical layer receiver 110 and decodes the parallel data.

The bridge circuit 130 is coupled to the lane receiver 120 for outputting the decoded parallel data to a rear-end circuit (not illustrated in the diagram). Examples of the bridge circuit 130 include a micro processing unit (MCU), a color processing unit and a serial peripheral interface (SPI). For example, if the serial data includes a write command, the bridge circuit 130, such as a micro processing unit, writes the decoded parallel data into the rear-end circuit such as a random access memory. If the serial data includes a control command, the control command is converted into a control signal by the bridge circuit 130, such as a serial peripheral interface, for controlling the rear-end circuit.

If the serial data includes a read command, the transmitter command encoder 140 receives the parallel data from the lane receiver 120, encodes the parallel data, and temporarily stores the encoded parallel data. The lane transmitter 150 is coupled to the bridge circuit 130 and the transmitter command encoder 140 for reading target parallel data from the rear-end circuit by the bridge circuit 130, and transmits the target parallel data to the physical layer transmitter 160 in the low power transmission mode according to the encoded parallel data temporarily stored in the transmitter command encoder 140. In the low power transmission mode, the lane transmitter 150 transmits the target parallel data to the physical layer transmitter 160 in the format of transistor transistor logic signal. The physical layer transmitter 160 converts the target parallel data into target serial data and outputs the target serial data. The transmitter I/O control unit 180 is coupled to the physical layer transmitter 160 for controlling the physical layer transmitter 160 to output the target serial data.

Figure 2:
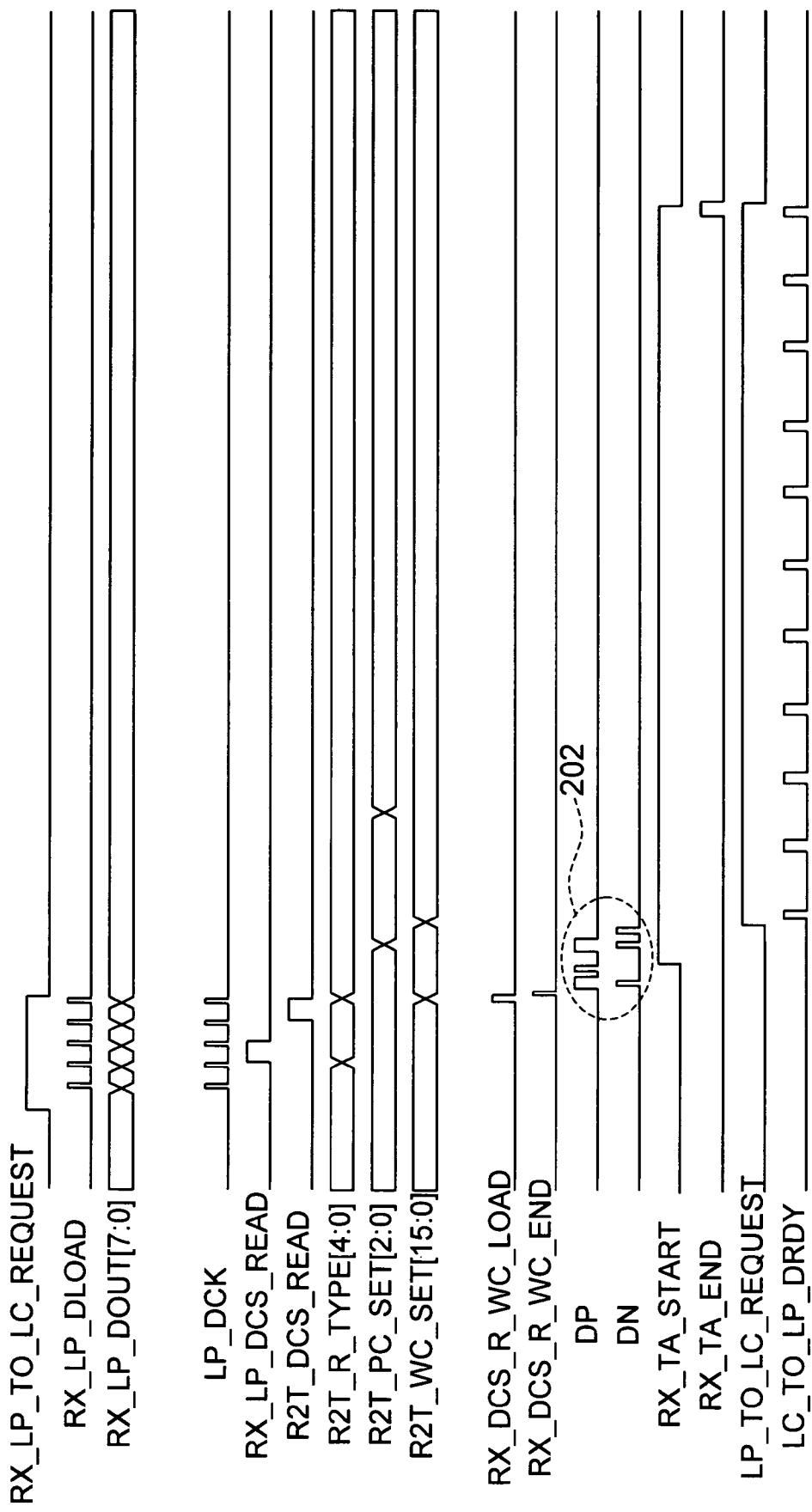
FIG. 2 shows a protocol waveform chart of the interface control circuit according to the preferred embodiment of the invention.

Referring to FIG. 2, a protocol waveform chart of the interface control circuit according to the preferred embodiment of the invention is shown. The physical layer receiver 110 substantially determines whether to activate a high speed transmission mode or a low power transmission mode according to a sequence of the serial data in the format of transistor transistor logic signal. The physical layer receiver 110 generates a control signal RX_LP_TO_LC_REQUEST, a control signal RX_LP_DLOAD and a data signal RX_LP_DOUT[7:0] according to whether the high speed transmission mode or the low power transmission mode is used, and transmits the parallel data to the lane receiver 120.

When the lane receiver 120 receives parallel data from the physical layer receiver 110, the lane receiver 120 starts to decode the parallel data. The lane receiver 120 performs subsequent processing according to the package obtained from decoding, wherein examples of the package include header and feedback information. If the lane receiver 120 decodes and obtains a write command, the decoded parallel data is directly written into the rear-end circuit by the bridge circuit 130. If the lane receiver 120 decodes and obtains a control command, the control command is converted into a control signal by the bridge circuit 130 for controlling a corresponding rear-end circuit.

If the lane receiver 120 decodes and obtains a read command, the transmitter command encoder 140 encodes and temporarily stores the parallel data. The lane receiver 120 decodes the data signal R2T_R_TYPE[4:0] to determine the rear-end circuit of the target data to be read from. The lane receiver 120 decodes the obtained feedback information including a data signal R2T_PC_SET[2:0] denoting a small volume of feedback data or a data signal R2T_WC_SET[15:0] denoting a large volume of feedback data. In FIG. 2, the clock signal LP_DCK is a clock signal of the parallel data, and the transmitter command encoder 140 generates a control signal RX_LP_DCS_READ and a control signal R2T_DCS_READ according to the clock signal LP_CDK. The lane transmitter 150 reads target parallel data from the target rear-end circuit according to the control signal RX_LP_DCS_READ and the control signal R2T_DCS_READ, and converts the target parallel data in the low power transmission mode to the physical layer transmitter 160.

The physical layer receiver 110 substantially receives a control signal DP and a control signal DN. The control signal DP and the control signal DN include a sequence 202 for determining reading. In the first half of the sequence 202, the physical layer receiver 110 is noticed to perform reading. Afterwards, the physical layer receiver 110 uses a control signal RX_TA_START to notice the physical layer transmitter 160 and turn off the universal serial bus at the input end. The physical layer transmitter 160 starts to boost the voltage level of the universal serial bus at the output end. After the voltage level of the universal serial bus at the output end is boosted to a steady state, the physical layer transmitter 160 uses a control signal LP_TO_LC_REQUEST to notice the lane transmitter 150 that the universal serial bus is ready for use.

The lane transmitter 150, incorporated by the encoded parallel data temporarily stored in the transmitter command encoder 140, transmits the target parallel signal to the physical layer transmitter 160 in the format of transistor transistor logic signal according to a control signal LC_TO_LP_DRDY. The physical layer transmitter 160 converts the received target parallel data into target serial data and outputs the target serial data. After the target serial data is outputted completely, the physical layer transmitter 160 turns off the universal serial bus at the output end, and uses the control signal RX_TA_END to notice the physical layer receiver 110 of the completion of data outputting. The physical layer receiver 110 activates the universal serial bus at the input end to receive the next item of serial data.

The interface control circuit 100 can be used in a portable product for example. Thus, serial transmission can be used in the transmission between the portable product and a host. Compared with conventional parallel transmission, serial transmission simplifies external circuit elements and is less interfered with by noises. When the transmission mode is the high speed transmission mode, the circuit elements enabled in the interface control circuit 100 belong to a synchronous circuit; when the transmission mode is not the high speed transmission mode, the circuit elements enabled in the interface control circuit 100 belong to an asynchronous circuit. If the synchronous circuit and the asynchronous circuit can be combined together, the circuit complexity of the interface control circuit 100 can be further reduced.

Figure 3:
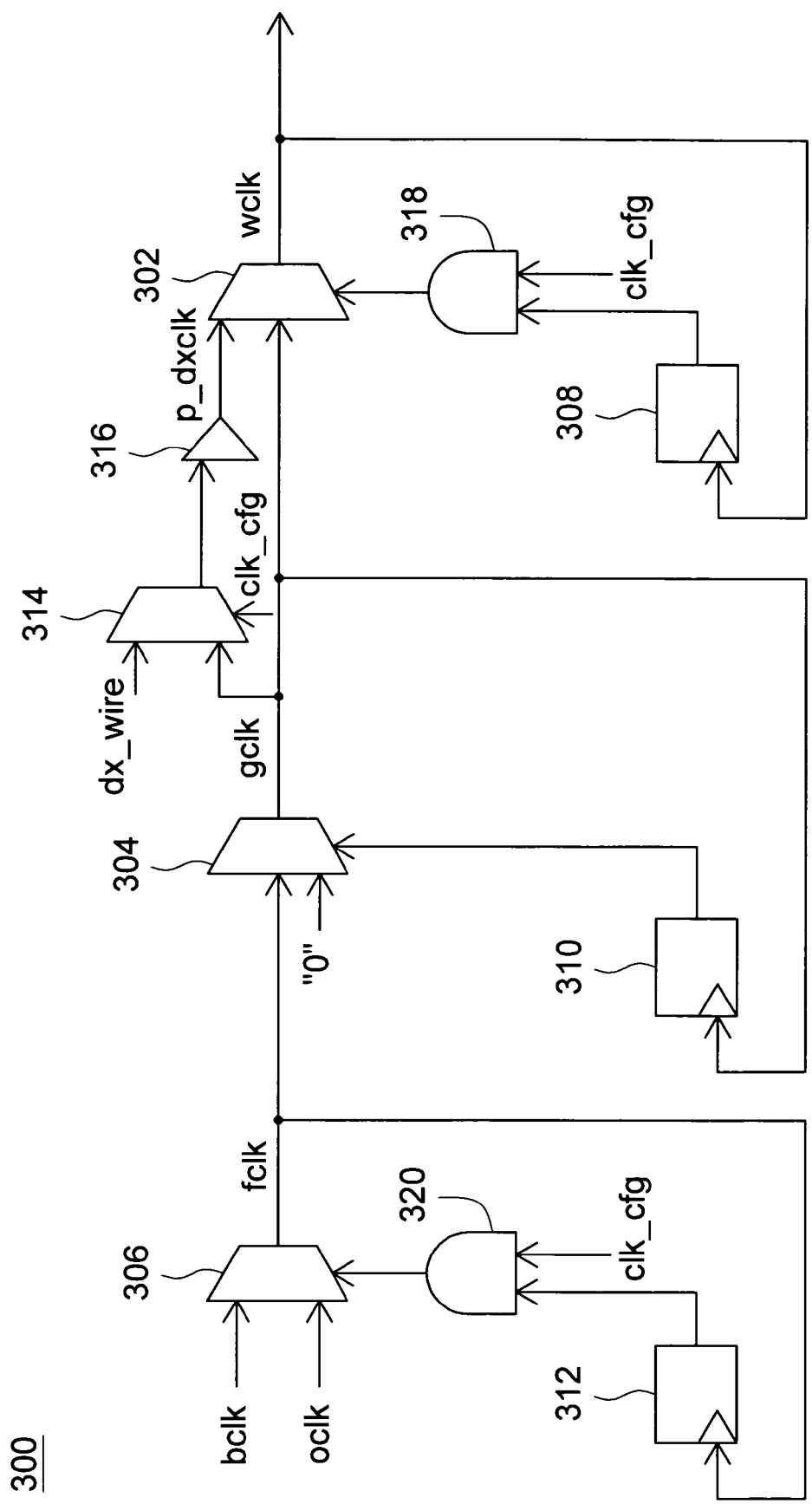
FIG. 3 shows a circuit diagram of a first clock control circuit according to the preferred embodiment of the invention.

The physical layer receiver 110 disposed in the interface control circuit 100 includes a first clock control circuit. Referring to FIG. 3, a circuit diagram of a first clock control circuit according to preferred embodiment of the invention is shown. The first clock control circuit 300, substantially being a main clock control circuit of the interface control circuit 100, includes a first switch device 302, a second switch device 304 and a third switch device 306. The first switch device 302 has a first input end, a second input end, an output end and a control end. The second switch device 304 has a first input end, a second input end, an output end and a control end. The third switch device 306 has a first input end, a second input end, an output end and a control end. The output end of the first switch device 302 outputs a working clock signal wclk. The first input end of the first switch device 302 receives a data clock signal p_dxclk. The second input end of the first switch device 302 receives a global clock signal gclk. The working clock signal wclk is provided to the physical layer receiver 110 itself, and the data clock signal p_dxclk substantially is obtained along with the serial data.

The output end of the second switch device 304 outputs the global clock signal gclk. The first input end of the second switch device 304 receives a reference clock signal fclk. The second input end of the second switch device 304 receives a low level voltage "0". The global clock signal gclk is also outputted to the lane receiver 120, the lane transmitter 150 and the physical layer transmitter 160. The output end of the third switch device 306 outputs the reference clock signal fclk. The first input end of the third switch device 306 receives a high speed clock signal bclk. The second input end of the third switch device 306 receives an internal oscillating clock signal oclk. The high speed clock signal bclk goes with the low voltage differential signal. The internal oscillating clock signal oclk is generated by an oscillator disposed in the physical layer receiver 110.

The physical layer receiver 110 receives serial data, and the data clock signal p_dxclk substantially is obtained along with the serial data. The first switch device 302 outputs the data clock signal p_dxclk as the working clock signal wclk for the physical layer receiver 110 itself to use. The physical layer receiver 110 determines to transmit the parallel data in a high speed transmission mode or a low power transmission mode according to the working clock signal wclk. If the physical layer receiver 110 determines to transmit the parallel data in the low power transmission mode, the first switch device 302 outputs the data clock signal p_dxclk as the working clock signal wclk, and the physical layer receiver 110 transmits the parallel data to the lane receiver 120 in the format of transistor transistor logic signal in the low power transmission mode according to the working clock signal wclk.

If the physical layer receiver 110 determines to transmit the parallel data in the high speed transmission mode, the third switch device 306 outputs the high speed clock signal bclk as the reference clock signal fclk, the second switch device 304 outputs the reference clock signal fclk as the global clock signal gclk, the first switch device 302 outputs the global clock signal gclk as the working clock signal wclk, and the physical layer receiver 110 transmits the parallel data to the lane receiver 120 in the format of low voltage differential signal in the high speed transmission mode according to the working clock signal wclk.

If the serial data includes a read command, the third switch device 306 outputs the internal oscillating clock signal oclk as the reference clock signal fclk, the second switch device 304 outputs the reference clock signal fclk as the global clock signal gclk, and the lane transmitter 150 transmits the target parallel data to the physical layer transmitter 160 in the low power mode according to the global clock signal gclk.

Moreover, the first clock control circuit 300 further includes a first delay flip-flop 308, a second delay flip-flop 310 and a third delay flip-flop 312. The first delay flip-flop 308 has an output end and a control end. The second delay flip-flop 310 has an output end and a control end. The third delay flip-flop 312 has an output end and a control end. The output end of the first delay flip-flop 308 is coupled to the control end of the first switch device 302, and the control end of the first delay flip-flop 308 is coupled to the output end of the first switch device 302. The output end of the second delay flip-flop 310 is coupled to the control end of the second switch device 304, and the control end of the second delay flip-flop 310 is coupled to the output end of the second switch device 304. The output end of the third delay flip-flop 312 is coupled to the control end of the third switch device 306, and the control end of the third delay flip-flop 312 is coupled to the output end of the third switch device 306. The first delay flip-flop 308, the second delay flip-flop 310 and the third delay flip-flop 312 more effectively enable synchronous circuits in the interface control circuit 100 to be synchronous. Besides, when the transmission mode is not the high speed transmission mode, the first delay flip-flop 308, the second delay flip-flop 310 and the third delay flip-flop 312 avoid the first switch device 302, the second switch device 304 and the third switch device 306 being affected by glitch.

The first clock control circuit 300 further includes a fourth switch device 314, a first amplifier 316 and a first AND gate 318. The fourth switch device 314 has a first input end, a second input end, an output end and a control end. The first amplifier 316 has an input end and an output end. The first AND gate 318 has a first input end, a second input end and an output end. The first input end of the fourth switch device 314 receives the global clock signal gclk. The second input end of the fourth switch device 314 receives an asynchronous clock signal dx_wire. The control end of the fourth switch device 314 receives a clock setting signal clk_cfg. The input end of the first amplifier 316 is coupled to the output end of the fourth switch device 314. The output end of the first amplifier 316 outputs the data clock signal p_dxclk to the first input end of the first switch device 302. The first input end of the first AND gate 318 is coupled to the output end of the first delay flip-flop 308. The second input end of the first AND gate 318 receives the clock setting signal clk_cfg. The output end of the first AND gate 318 is coupled to the control end of the first switch device 302.

When the clock setting signal clk_cfg is at a high level voltage, the fourth switch device 314 outputs the asynchronous clock signal dx_wire, the first amplifier 316 amplifies the asynchronous clock signal dx_wire as the data clock signal p_dxclk, and the first switch device 302 outputs the data clock signal p_dxclk as the working clock signal wclk. When the clock setting signal clk_cfg is at a low level voltage, the fourth switch device 314 outputs the global clock signal gclk, and the first switch device outputs the global clock signal gclk as the working clock signal wclk.

The first clock control circuit 300 further includes a second AND gate 320. The second AND gate 320 has a first input end, a second input end and an output end. The first input end of the second AND gate 320 is coupled to the output end of the third delay flip-flop 312. The second input end of the second AND gate 320 receives the clock setting signal clk_cfg. The output end of the second AND gate 320 is coupled to the control end of the third switch device 306. When the clock setting signal clk_cfg is at the high level voltage, the third switch device 306 outputs the internal oscillating clock signal oclk as the reference clock signal fclk. When the clock setting signal clk_cfg is at the low level voltage, the third switch device 306 outputs the high speed clock signal bclk as the reference clock signal fclk.

Figure 4:
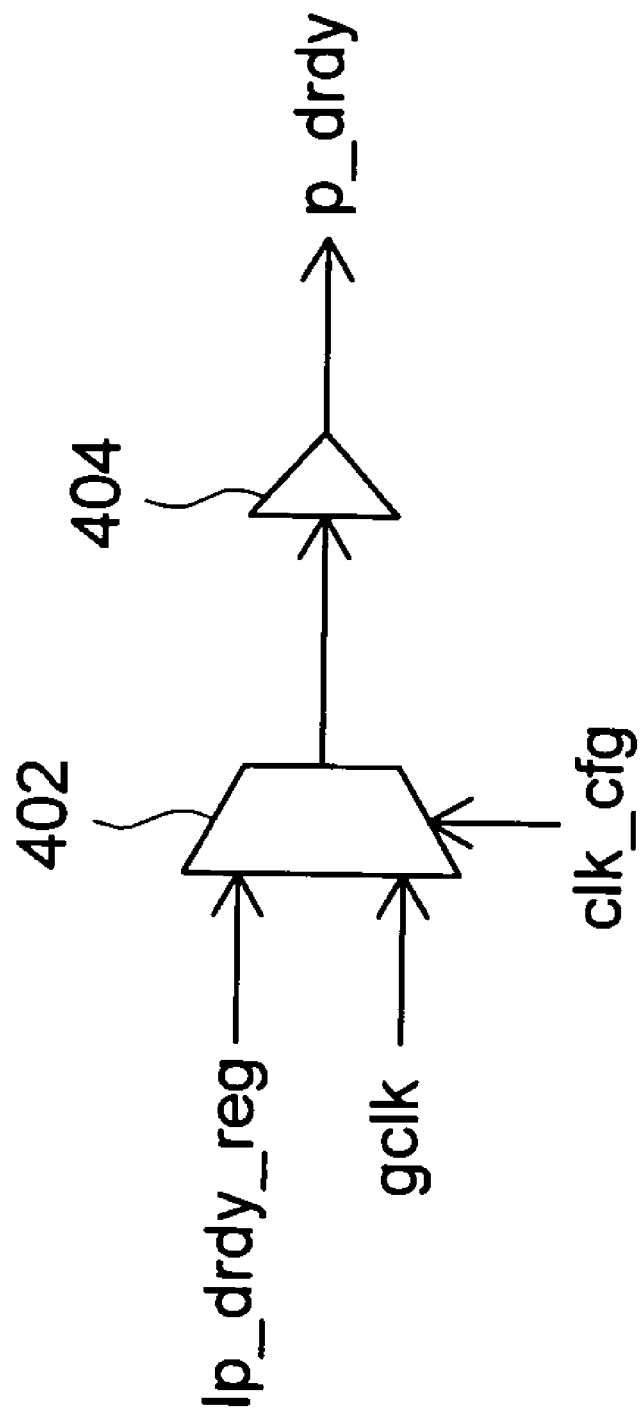
FIG. 4 shows a circuit diagram of a second clock control circuit according to the preferred embodiment of the invention.

Besides, the lane receiver 120 includes a second clock control circuit. Referring to FIG. 4, a circuit diagram of the second clock control circuit according to the preferred embodiment of the invention is shown. The second clock control circuit 400 includes a fifth switch device 402 and a second amplifier 404. The fifth switch device 402 has a first input end, a second input end, an output end and a control end. The second amplifier 404 has an input end and an output end. The first input end of the fifth switch device 402 receives an external clock signal lp_drdy_reg. The second input end of the fifth switch device 402 receives the global clock signal gclk. The control end of the fifth switch device 402 receives the clock setting signal clk_cfg. The input end of the second amplifier 404 is coupled to the output end of the fifth switch device 402. The output end of the second amplifier 404 outputs the data low speed clock signal p_drdy.

When the clock setting signal clk_cfg is at the high level voltage, the fifth switch device 402 outputs the external clock signal lp_drdy_reg to the second amplifier 404, the second amplifier 404 outputs the data low speed clock signal p_drdy, and the lane receiver 120 transmits the parallel data to the bridge circuit 130 or transmitter command compiler 140 in the low power mode according to the data low speed clock signal p_drdy. When the clock setting signal clk_cfg is at the low level voltage, the fifth switch device 402 outputs the global clock signal gclk to the second amplifier 404.

The interface control circuit disclosed in the embodiment of the invention can be used in a portable product. Thus, serial transmission can be used in the transmission between the portable product and the host. Compared with conventional parallel transmission, serial transmission simplifies external circuit elements and is less interfered with by noises. Besides, when the transmission mode is the high speed transmission mode, only effective synchronous circuit elements in the interface control circuit are activated; when the transmission mode is not the high speed transmission mode, asynchronous circuit elements are used to reduce power consumption. Furthermore, clock control circuits effectively combine synchronous circuits with asynchronous circuits, not only simplifying the control circuit but also reducing the complexity of the interface control circuit.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An interface control circuit, comprising:
    a physical layer receiver for receiving and converting serial data into parallel data, and determining to transmit the parallel data in a high speed transmission mode or a low power transmission mode according to the serial data;
    a lane receiver for receiving and decoding the parallel data;
    a bridge circuit for outputting the decoded parallel data;
    a transmitter command encoder for encoding the parallel data if the serial data comprises a read command;
    a lane transmitter for receiving target parallel data from the bridge circuit, and transmitting the target parallel data in the low power transmission mode according to the encoded the parallel data; and
    a physical layer transmitter for converting the target parallel data into target serial data and outputting the target serial data.

2. The interface control circuit according to claim 1, further comprising:
    a receiver I/O control unit coupled to the physical layer receiver for controlling the physical layer receiver to receive the serial data; and
    a transmitter I/O control unit coupled to the physical layer transmitter for controlling the physical layer transmitter to output the target serial data.

3. The interface control circuit according to claim 1, wherein in the high speed transmission mode, the physical layer receiver transmits the parallel data to the lane receiver by a low voltage differential signal format.

4. The interface control circuit according to claim 1, wherein in the low power transmission mode, the physical layer receiver transmits the parallel data to the lane receiver by a transistor transistor logic signal format.

5. The interface control circuit according to claim 1, wherein in the low power transmission mode, the lane transmitter transmits the target parallel data to the physical layer transmitter by a transistor transistor logic signal format.

6. The interface control circuit according to claim 1, wherein the physical layer receiver comprises a first clock control circuit that includes
    a first switch device having a first input end, a second input end, an output end and a control end, wherein the output end of the first switch device outputs a working clock signal, the first input end of the first switch device receives a data clock signal, and the second input end of the first switch device receives a global clock signal;
    a second switch device having a first input end, a second input end, an output end and a control end, wherein the output end of the second switch device outputs the global clock signal, the first input end of the second switch device receives a reference clock signal, and the second input end of the second switch device receives a low level voltage; and
    a third switch device having a first input end, a second input end, an output end and a control end, wherein the output end of the third switch device outputs the reference clock signal, the first input end of the third switch device receives a high speed clock signal, and the second input end of the third switch device receives an internal oscillating clock signal.

7. The interface control circuit according to claim 6, wherein the second switch device further outputs the global clock signal to the lane receiver, the lane transmitter and the physical layer transmitter.

8. The interface control circuit according to claim 6, wherein the first switch device outputs the data clock signal as the working clock signal, the physical layer receiver determines to transmit the parallel data in the high speed transmission mode or the low power transmission mode according to the working clock signal.

9. The interface control circuit according to claim 8, wherein if the physical layer receiver determines to transmit the parallel data in the low power transmission mode, the first switch device outputs the data clock signal as the working clock signal, and the physical layer receiver transmits the parallel data in the low power transmission mode according to the working clock signal.

10. The interface control circuit according to claim 8, wherein if the physical layer receiver determines to transmit the parallel data in the high speed transmission mode, the third switch device outputs the high speed clock signal as the reference clock signal, the second switch device outputs the reference clock signal as the global clock signal, the first switch device outputs the global clock signal as the working clock signal, and the physical layer receiver transmits the parallel data in the high speed transmission mode according to the working clock signal.

11. The interface control circuit according to claim 8, wherein if the serial data comprises the read command, the third switch device outputs the internal oscillating clock signal as the reference clock signal, the second switch device outputs the reference clock signal as the global clock signal, and the lane transmitter transmits the target parallel data to the physical layer transmitter in the low power transmission mode according to the global clock signal.

12. The interface control circuit according to claim 6, wherein the first clock control circuit further comprises:
    a first delay flip-flop having an output end and a control end, wherein the output end of the first delay flip-flop is coupled to the control end of the first switch device, and the control end of the first delay flip-flop is coupled to the output end of the first switch device;
    a second delay flip-flop having an output end and a control end, wherein the output end of the second delay flip-flop is coupled to the control end of the second switch device, and the control end of the second delay flip-flop is coupled to the output end of the second switch device; and
    a third delay flip-flop having an output end and a control end, wherein the output end of the third delay flip-flop is coupled to the control end of the third switch device, and the control end of the third delay flip-flop is coupled to the output end of the third switch device.

13. The interface control circuit according to claim 12, wherein the first clock control circuit further comprises:
    a fourth switch device having a first input end, a second input end, an output end and a control end, wherein the first input end of the fourth switch device receives the global clock signal, the second input end of the fourth switch device receives an asynchronous clock signal, and the control end of the fourth switch device receives a clock setting signal;
    a first amplifier having an input end and an output end, wherein the input end of the first amplifier is coupled to the output end of the fourth switch device, the output end of the first amplifier outputs the data clock signal to the first input end of the first switch device; and
    a first AND gate having a first input end, a second input end and an output end, wherein the first input end of the first AND gate is coupled to the output end of the first delay flip-flop, the second input end of the first AND gate receives the clock setting signal, and the output end of the first AND gate is coupled to the control end of the first switch device.

14. The interface control circuit according to claim 13, wherein when the clock setting signal is at a high level voltage, the fourth switch device outputs the asynchronous clock signal to the first amplifier, the first amplifier amplifies the asynchronous clock signal as the data clock signal, and the first switch device outputs the data clock signal as the working clock signal.

15. The interface control circuit according to claim 13, wherein when the clock setting signal is at the low level voltage, the first switch device outputs the global clock signal as the working clock signal.

16. The interface control circuit according to claim 12, wherein the first clock control circuit further comprises:
a second AND gate having a first input end, a second input end and an output end, wherein the first input end of the second AND gate is coupled to the output end of the third delay flip-flop, the second input end of the second AND gate receives the clock setting signal, and the output end of the second AND gate is coupled to the control end of the third switch device.

17. The interface control circuit according to claim 16, wherein when the clock setting signal is at a high level voltage, the third switch device outputs the internal oscillating clock signal as the reference clock signal, and when the clock setting signal is at the low level voltage, the third switch device outputs the high speed clock signal as the reference clock signal.

18. The interface control circuit according to claim 1, wherein the lane receiver comprises a second clock control circuit that includes
a fifth switch device having a first input end, a second input end, an output end and a control end, wherein the first input end of the fifth switch device receives an external clock signal, the second input end of the fifth switch device receives a global clock signal, and the control end of the fifth switch device receives a clock setting signal; and
a second amplifier having an input end and an output end, wherein the input end of the second amplifier is coupled to the output end of the fifth switch device, and the output end of the second amplifier outputs a data low speed clock signal.

19. The interface control circuit according to claim 18, wherein when the clock setting signal is at a high level voltage, the fifth switch device outputs the external clock signal, and when the clock setting signal is at a low level voltage, the fifth switch device outputs the global clock signal.

20. The interface control circuit according to claim 19, wherein the fifth switch device outputs the external clock signal, the second amplifier outputs the data low speed clock signal, and the lane receiver transmits the parallel data in the low power mode according to the data low speed clock signal.

\* \* \* \* \*